(12) United States Patent
Kang et al.

(10) Patent No.: US 8,575,574 B2
(45) Date of Patent: Nov. 5, 2013

(54) ION IMPLANTING SYSTEM

(75) Inventors: Jin-Hee Kang, Yongin (KR); Chun-Gi You, Yongin (KR); Sun Park, Yongin (KR); Jong-Hyun Park, Yongin (KR); Yul-Kyu Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 310 days.

(21) Appl. No.: 12/962,829

(22) Filed: Dec. 8, 2010

(65) Prior Publication Data

US 2011/0140005 A1    Jun. 16, 2011

(30) Foreign Application Priority Data

Dec. 14, 2009    (KR) .................. 10-2009-0124098

(51) Int. Cl.
*G21G 5/00* (2006.01)
(52) U.S. Cl.
USPC ................ 250/492.3; 250/492.2; 250/492.21
(58) Field of Classification Search
USPC ....................................................... 250/492.3
See application file for complete search history.

(56) References Cited

U.S. PATENT DOCUMENTS

| | | | | |
|---|---|---|---|---|
| 4,346,301 A | * | 8/1982 | Robinson et al. | 250/492.2 |
| 5,751,003 A | * | 5/1998 | Rose et al. | 250/492.21 |

FOREIGN PATENT DOCUMENTS

| | | |
|---|---|---|
| JP | 2664121 | 10/1997 |
| JP | 4252237 | 1/2009 |
| KR | 10-2004-0098463 | 11/2004 |
| KR | 10-2008-0010094 | 1/2008 |
| KR | 10-2008-0106956 | 12/2008 |

OTHER PUBLICATIONS

English-language Patent Abstract of JP 06-252079.
English-language Patent Abstract of JP 2003-208869.

* cited by examiner

*Primary Examiner* — Phillip A Johnston
(74) *Attorney, Agent, or Firm* — H.C. Park & Associates, PLC (57) ABSTRACT

An ion implanting system includes an ion generating system that generates ion beams and an ion implanting chamber in which a work-piece that is irradiated with the ion beams generated from the ion generating system is provided and into which the ion beams generated from the ion generating unit are directed. The ion generating system includes a first ion generating unit that irradiates ions to an upper portion of the work-piece and a second ion generating unit irradiating ions to a lower portion of the work-piece. The ion implanting system a can implant ions into a large work-piece through one ion implantation process with ion generating units arranged alternately with respect to each other in the transfer direction of the work-piece.

13 Claims, 6 Drawing Sheets

ION IMPLANTING SYSTEM

CROSS-REFERENCE TO RELATED APPLICATION

This application claims the benefit of Korean Patent Application No. 10-2009-0124098, filed on Dec. 14, 2009, in the Korean Intellectual Property Office, the disclosure of which is incorporated herein by reference.

BACKGROUND

1. Field

The described technology relates generally to an ion implanting system. More particularly, the described technology relates to an ion implanting system that can implant ions into a large glass substrate.

2. Description of the Related Art

Ion implantation is a commercially available technique to induce a dopant into a work-piece such as a thin film deposited on a semiconductor wafer or a glass substrate in order to change the conductivity of the work-piece.

A conventional ion implanting system includes an ion source that ionizes a predetermined dopant element and accelerates the ionized element to form an ion beam of regulated energy. The ion beam is then directed onto the surface of the work-piece.

Typically, energetic ions of the ion beam penetrate into a work piece and then become embedded in a crystal lattice of a material of the work piece to form an area having a predetermined conductivity.

An ion implantation process is performed under a high vacuum in an airtight process chamber that surrounds a work-piece handing assembly, a work-piece supporting device, and an ion source. Such a high vacuum environment prevents scattering of the ion beams due to collision with gas molecules and minimizes contamination of the work-piece by particles in air.

The conventional ion implanting system has a problem of taking a long time to process a work piece since the conventional system processes work-pieces sequentially.

Particularly, the size of display devices has increased through many generations. For ion implantation into a glass substrate in the manufacturing of a large display device (e.g., an eighth generation device), the ion implantation process is carried out by repeatedly reciprocating the glass substrate. Thus, the tact time of the ion implantation process for the large glass substrate is long due to the iteration of the ion implantation process.

Alternatively, the ion implantation into a large work-piece can be carried out by performing the process only once if a large enough ion source is used. However, the use of an ion source large enough to treat a large work-piece in a single pass is inefficient in terms of cost and space requirements.

Thus, a common goal of ion implanting systems is to increase the throughput of the system for large work-pieces. However, conventional systems have not yet fully satisfied such requirements in manufacturing ability and price and thus, development of an ion implantation system that can implant ions in accordance with the increasing size of display devices is desired.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an ion implanting system that can implant ions into a large work-piece.

An ion implanting system according to an exemplary embodiment includes an ion generating system that generates ion beams and an ion implanting chamber in which a work-piece that is irradiated with the ion beams generated from the ion generating system is provided and into which the ion beams generated from the ion generating system are directed. The ion generating system includes a first ion generating unit that irradiates ions to an upper portion of the work-piece and a second ion generating unit that irradiates ions to a lower portion of the work-piece.

According to a non-limiting aspect, the ion implanting system may include a work-piece transfer guiding unit provided in the ion implanting chamber that moves the work-piece through the ion implanting chamber in a direction that is perpendicular to the implantation direction of the ion beams.

According to a non-limiting aspect, the first and second ion generating units may each respectively include a plurality of ion generators arranged parallel with each other at the same height in a horizontal direction.

According to a non-limiting aspect, the first and second ion generating units may each respectively include two ion generators.

According to a non-limiting aspect, the plurality of ion generators of the first ion generating unit and the plurality of ion generators of the second ion generating unit may be arranged in an alternating pattern.

According to a non-limiting aspect, the first and second ion generating units are located such that when the work-piece moves in the horizontal direction through the ion implanting chamber, the work-piece is first implanted with ions generated from the ion generator of a first ion generating unit.

According to a non-limiting aspect, the first and second ion generating units are located such that when the work-piece moves in the horizontal direction through the ion implanting chamber, the work-piece is first implanted with ions generated from an ion generator of the second generating unit.

According to a non-limiting aspect, an area of the work-piece implanted with ion beams generated from the first ion generating unit and an area of the work-piece implanted with ion beams generated from the second ion generating unit may do not overlap each other.

According to a non-limiting aspect, one side of the ion implanting chamber includes a plurality of slits through which ion beams from ion generators of the first and second generating units are respectively directed.

According to a non-limiting aspect, each slit may have a width of 5.5 mm and a height of 1,250 mm.

According to a non-limiting aspect, the ion generating unit may include: a housing; an ion generating unit provided in the housing and that generates plasma including ion desired species to be implanted in a substrate; a power supply that supplies power to the ion generating unit; a mass separator that separates ions of the ion beams according to mass; an ion accelerator that accelerates ions separated by the mass separator; and an opening provided at one side of the housing, and in which a slit through which the ions accelerated by the ion accelerator are directed to the ion implanting chamber is provided.

An ion implanting system according to an exemplary embodiment includes an ion generating system that generates ion beams, an ion implanting chamber in which a work-piece that is irradiated with the ion beams generated from the ion generating system is provided and into which the ion beams generated from the ion generating system are directed, and a work-piece transfer guiding unit provided in the ion implanting chamber that moves the work-piece through the ion implanting chamber in a direction that is perpendicular to an implantation direction of the ion beams, wherein the ion generating system comprises a first set of ion generators that irradiate ions to a first portion of the work-piece as the work-piece moves through the ion implanting chamber and a second ion set of ion generators that irradiate ions to a second portion of the work-piece as the work-piece moves through the ion implanting chamber.

The ion implanting system according to the exemplary embodiment can finish ion implantation to a large work-piece by performing an implanting process once while the work-piece passes through the ion implanting chamber because ion generators are arranged alternately to each other with respect to the transfer direction of the work-piece so that tact time of the ion implantation process can be significantly reduced.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 1:
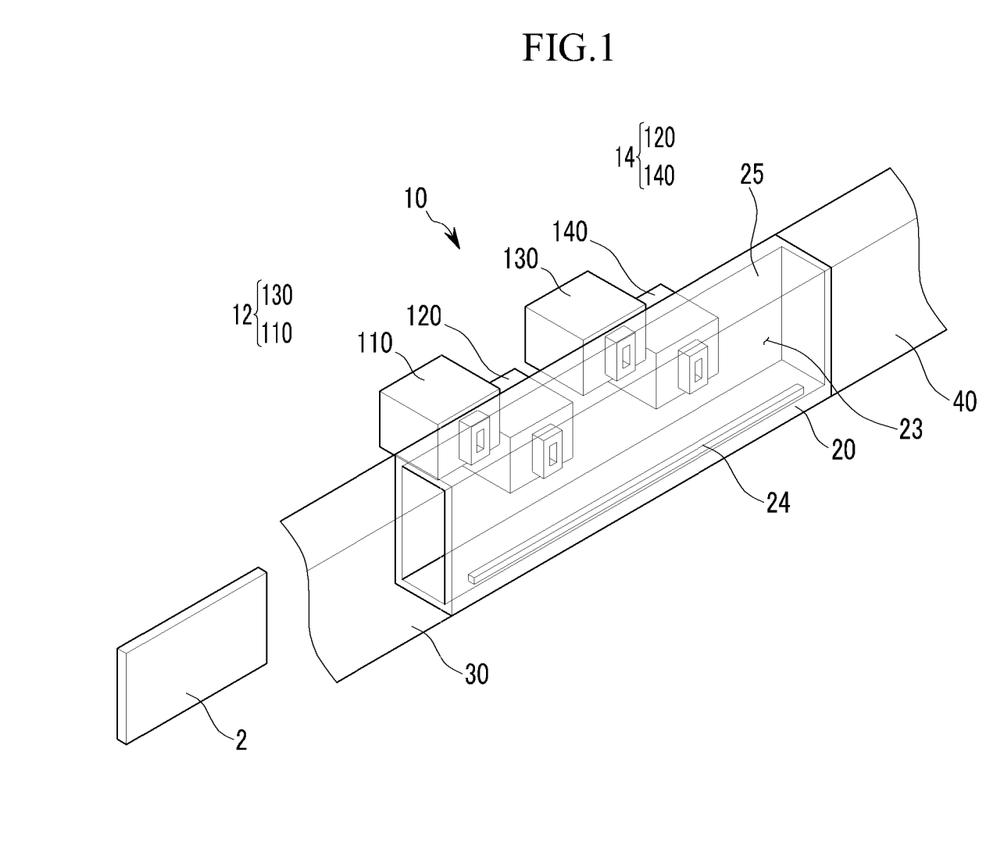
FIG. 1 is a perspective view of an ion implanting system according to an exemplary embodiment.
Figure 2:
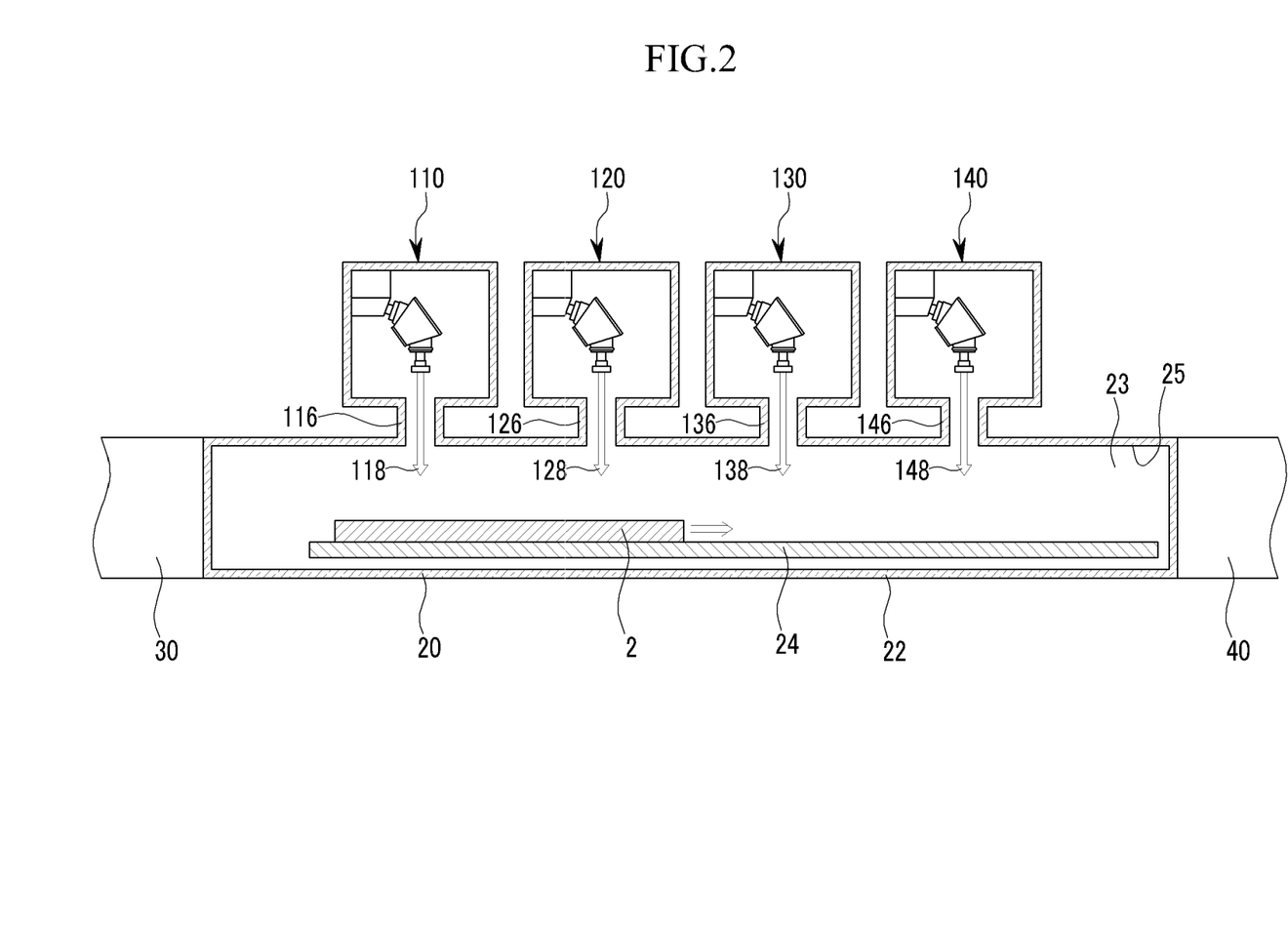
FIG. 2 is a top plan view of a configuration of the ion implanting system according to the exemplary embodiment.

FIG. 1 is a perspective view of an ion implanting system according to an exemplary embodiment, and FIG. 2 is a top plan view of the ion implanting system according to the exemplary embodiment.

Referring to FIG. 1, an ion implanting system 10 according to an exemplary embodiment includes first and the second ion generating units 12 and 14 and an ion implanting chamber 20.

The first and second ion generating units 12 and 14 include ion generators that generate ions for ion implantation in the ion implanting chamber 20.

The first ion generating unit 12 includes an ion generator that implants ions in an upper portion of a substrate 2, and the second ion generating unit 14 includes an ion generator that implants ions in a lower portion of the substrate 2. As used herein, the term "upper" portion of the substrate indicates an upper portion from the center of the substrate in the height direction thereof, and the term "lower" portion of the substrate indicates a lower portion from the center of the substrate in the height direction. In particular, as used herein, the terms "upper portion" and "lower portion" may be with reference to an ion implanting system that implants ions in a substrate that passes through the ion implanting system in a vertical orientation. It is to be understood that ion implanting systems having other orientations of the substrate may be used. To describe ion implanting systems in which the substrate is not in a vertical orientation, the terms "first" and "second" may be substituted for "upper" and "lower," respectively.

In further detail, the first ion generating unit 12 includes a plurality of ion generators directed to implant ions in the upper portion of the substrate 2 and arranged in parallel with each other. In the present exemplary embodiment, the first ion generating unit 12 includes two ion generators, referred to herein as the first ion generator 110 and the third ion generator 130.

The second ion generating unit 14 includes a plurality of ion generators directed to implant ions in the lower portion of the substrate 2 and arranged in parallel with each other. In the present exemplary embodiment, the second ion generating unit 14 includes two ion generators, referred to herein as the second ion generator 120 and the fourth ion generator 140.

The four ion generators 110, 120, 130, and 140 respectively generate ions to be implanted in a work-piece, and are arranged to be vertically alternate to each other with respect to an external wall 25 of the ion implanting chamber from the view of the proceeding direction (i.e., left to right direction in FIG. 1) of the ion implanted work-piece. That is, the four ion generators may be arranged in an order of the first ion generator 110 (upper), the second ion generator 120 (lower), the third ion generator 130 (upper) and the fourth ion generator 140 (lower).

In further detail, the first ion generator 110 and the third ion generator 130 are disposed at a predetermined height from the bottom of an upper portion of the sidewall 25 of the ion implanting chamber 20 to implant ions in an upper portion of the work-piece.

In addition, the second and fourth ion generators 120 and 140 are disposed at a lower portion of the sidewall 25 of the ion implanting chamber 20 to implant ions in a lower portion of the work-piece.

Openings of the respective four ion generators 110, 120, 130, and 140 contact the sidewall 25 of the ion implanting chamber 20 and slits 117, 127, 137, and 147 are formed at portions of the sidewall 25 of the ion implanting chamber 20, contacting the openings 116, 126, 136, and 146. Thereby, ions generated from an ion source of each of the four ion generators 110, 120, 130, and 140 may be directed into the ion implanting chamber 20.

Figure 3:
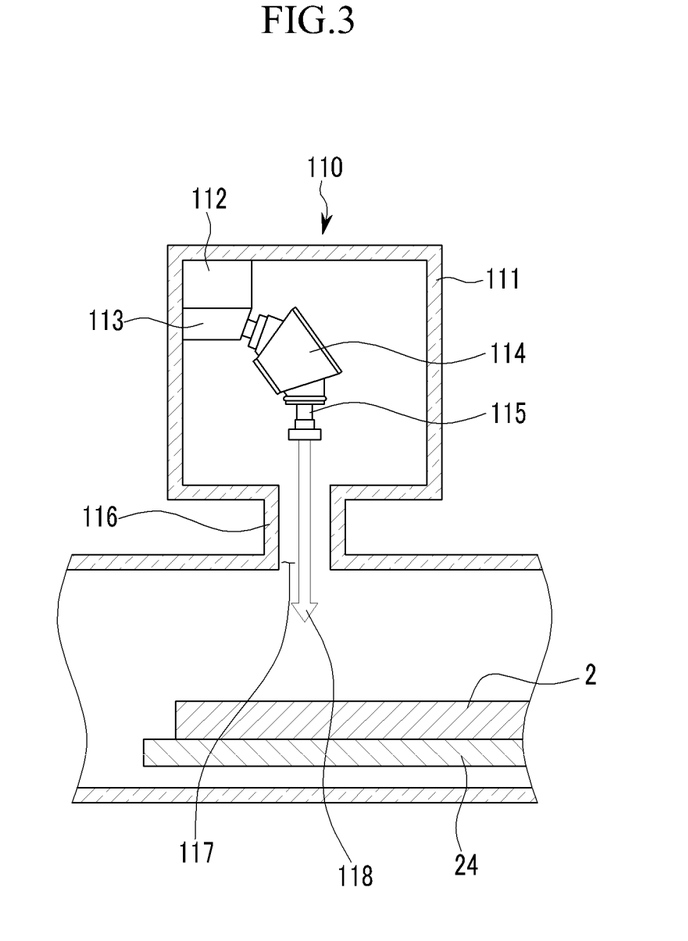
FIG. 3 is a schematic diagram of an internal configuration of an ion generator of the ion implanting system according to the exemplary embodiment.

FIG. 3 schematically shows constituent elements of the first ion generator 110. Since the second to fourth ion generators 120, 130, and 140 may have the same structure as of the first ion generator 110, only the structure of the first ion generator 110 will be described in further detail.

Referring to FIG. 3, the first ion generator 110 includes a housing 111, a power supply 112, an ion source 113, a mass separator 114, and an ion accelerator 115.

The housing 111 forms a body surrounding constituent elements of the first ion generator 110.

The power supply 112 supplies power to the ion source 113 and the constituent elements of the first ion generator 110.

The ion source 113 is a generation source of ions that generate a plasma including desired ion species to be implanted in the substrate 2.

The mass separator 114 includes a mass separation magnet that separates ions from the plasma according to mass. In particular, ions from the ion source 113 are directed along a path that is bent in an arc shape by the magnet while passing through the mass separator 114, and the ions are separated by mass during this process.

The ion accelerator 115 accelerates the ions separated by the mass separator 114, forming an ion beam 118.

The ions accelerated by the ion accelerator 115 are directed into the ion implanting chamber 25 through the slit 117 of the opening 116 provided at one side of the housing 111.

According to the exemplary embodiment, the four ion generators 110, 120, 130, and 140 are connected to the sidewall 25 of the ion implanting chamber 20 and therefore the four slits 117, 127, 137, and 147 respectively connected with the openings 116, 126, 136, and 146 of the respective four ion generators 110, 120, 130, and 140 are provided at one sidewall 25 of the ion implanting chamber 20.

Figure 5:
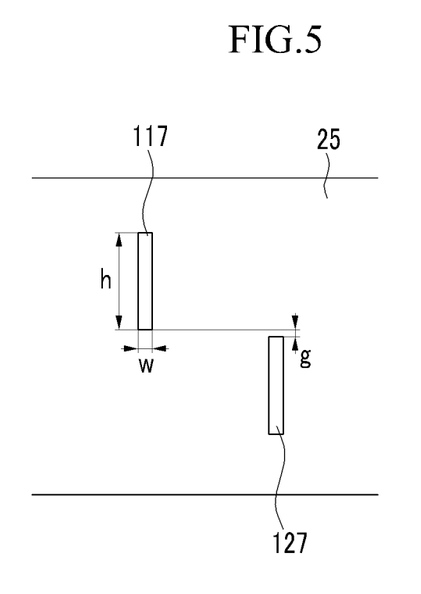
FIG. 5 is an enlarged view of an internal sidewall of an ion implanting chamber of the ion implanting system according to the exemplary embodiment.

Referring to FIG. 5, the slit 117 may have a width w of 5.5 mm and a height h of 1,250 mm according to the present exemplary embodiment. Here the "width w" of the slit 117 refers to a distance in the same direction that the substrate 2 passes through the processing chamber 20 and the "height h" refers to a distance perpendicular to the width. In an ion implanting system 10 that processes a substrate 2 that passes through the processing chamber 20 in an upright orientation, the "width w" refers to a distance in the horizontal direction and the "height h" refers to a distance in the vertical direction.

As described, when the height of the slit 117 is 1,250 mm, ion implantation into an eighth generation substrate (2200 mm×2500 mm) can be achieved by performing an implantation process only once using the ion implanting system 10 according to the exemplary embodiment, since the combined height of 1,250 mm of an upper portion and 1,250 of a lower portion equals the height of the eighth generation substrate.

Referring back to FIG. 1 and FIG. 2, the ion implanting chamber 20 into which the ions from the ion generators are directed includes a chamber housing 22 and a substrate transfer guiding unit 24.

The chamber housing 22 forms a vacuumed space in which the substrate 2 is internally transferred during an ion implantation process.

A loading chamber 30 is provided at one external side of the chamber housing 22 to load and transfer the substrate 2 to the ion implanting chamber 20.

An unloading chamber 40 is provided at the other external side of the loading chamber 30 to unload a substrate to which ion implantation is finished.

The substrate transfer guiding unit 24 is provided in an inner portion 22 of the chamber housing 22 to transfer the substrate 2.

The substrate transfer guiding unit 24 may include a substrate transferring device (not shown) to transfer a transfer guide to which the substrate is transferred. Accordingly, the substrate 2 is moved into one side of the ion implanting chamber 20 from the loading chamber 30, then is transferred through the implanting chamber 20 by the substrate transfer guiding unit 24 and then is transferred to the unloading chamber 40 at the other side of the ion implanting chamber 20.

FIG. 1 schematically shows the substrate transfer guiding unit 24, the loading chamber 20, and the unloading chamber 40 for simplification of the drawing. It is to be understood that the substrate transfer guiding unit 24, the loading chamber 30 and the unloading chamber 40 can be provided according to any of various known types of substrate transferring devices and loading/unloading chambers, and a detailed description thereof is not necessary.

While the substrate 2 passes through the ion implanting chamber 20, ions directed into the ion implanting chamber 20 from the plurality of ion generators 110, 120, 130, and 140 are irradiated onto the surface of the substrate 2.

The ion implanting chamber 20 may be connected to a vacuum pumping system (not shown) to maintain the ion implanting chamber 20 in a vacuum state during ion implantation.

In the exemplary embodiment, two ion generators are respectively provided to each of the upper and lower portions of the ion implanting chamber 20 in order to provide a double amount of ion implantation to the substrate 2 while the substrate 2 passes through the ion implanting chamber 20 once.

Therefore, it is not necessary to perform multiple reciprocation processes of the substrate as may be required during a conventional ion implantation process, but instead, the ion implantation may be achieved in one passing of the substrate 2 through the implanting chamber 20. Thereby, the tact time of the ion implantation process can be reduced more than 50% compared to the conventional process.

The ion amount implanted by an ion generator may vary according to performance and condition of the ion generator. The number of ion generators provided in the upper and lower portions may be two or more, or three to four according to the amount of ion to be implanted.

The size of slit that specifies the irradiation range of the ions implanted from the ion generator may be controlled according to the size of a substrate to which the ions are irradiated.

The slits 117, 127, 137, and 147 provided at the upper and lower portions of the sidewall 25 of the ion implanting chamber 20 may be arranged alternate to each other. In this case, the slits 117, 127, 137, and 147 should not overlap each other in the transfer direction of the substrate.

Accordingly, as shown in FIG. 5, the slits 117, 127, 137, and 147 neighboring each other are spaced apart from each other by a predetermined gap g in a direction perpendicular to the transfer direction of the substrate 2.

When the slits overlap with each other in the transfer direction of the substrate 2, the ion implantation is performed four times rather than two times in the region of overlap of the substrate 2 because the center portion of the substrate 2, moving along the horizontal direction is implanted with all the ions from the first to fourth slits 117, 127, 137, and 147 provided at the upper portion of the substrate 2, and accordingly two times of the desired amount of ions are implanted to the substrate 2, thereby causing quality deterioration.

Therefore, the lower portions of the slits 117 and 137 disposed at the upper portion of the ion implanting chamber 20 may be positioned higher than the center height of the moving substrate 2 and upper portions of the slits 127 and 147 disposed at the lower portion of the ion implanting chamber 20 may be positioned lower than the center height of the moving substrate 2.

Figure 4A:
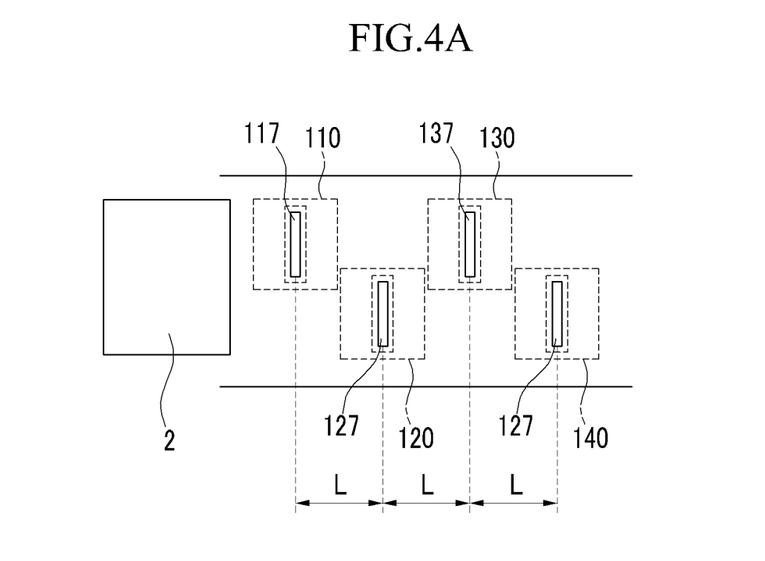
FIG. 4A to FIG. 4D show ion implantation process of ion to a substrate by using the ion implanting system according to the exemplary embodiment.

In addition, as shown in FIG. 4A, the first to fourth slits formed in the sidewall 25 of the ion implanting chamber 20 may be spaced apart from each other at a predetermined distance L in the horizontal direction. The reason for spacing the first to fourth ion generators 110, 120, 130, and 140 apart from each other is because each ion generator occupies a predetermined volume.

As in the present exemplary embodiment, the total space taken up by a plurality of ion generators can be minimized by arranging the first to fourth ion generators 110, 120, 130, and 140 in an alternating pattern.

If there is no need to conserve space for the ion generators, two ion generators may be arranged adjacent to each other in parallel at the upper portion with respect to the moving direction of the substrate and two ion generators may be arranged in parallel at the lower portion.

In addition, the location of the ion generators can be variously modified by disposing two ion generators at the upper portion of the sidewall 25 of the ion implanting chamber 20 and disposing two ion generators at the lower portion thereof. In this case, the space taken up by the ion generators is larger than that of the ion generators arranged alternate to each other so that the size of the ion implanting chamber may be increased.

In the present exemplary embodiment, the first slit 117 is disposed at the upper portion. Alternatively, the first slit 117 may be disposed at the lower portion.

When the first slit 117 is disposed at the lower portion, the second slit is disposed at the upper portion for an alternate arrangement with adjacent slits. Then, the third slit 137 may be disposed parallel with the first slit at the lower portion and the fourth slit 147 may be disposed parallel with the second slit at the upper portion.

A process for ion implantation to the substrate using the above-described ion implanting system will now be described.

FIG. 4A to FIG. 4D shows ion implanted areas of the substrate while the substrate passes through the ion implanting chamber.

Referring to FIG. 4A to FIG. 4D, the substrate 2, after being moved to one side (left side in FIG. 4A) of the ion implanting chamber 20 from the loading chamber 30, is transferred through the implanting chamber 20 to the other side (right side in FIG. 4A) of the ion implanting chamber 20 by the substrate transfer guiding unit 24.

During the transfer, the ion implanting chamber 20 is maintained in a vacuum state by the vacuum pumping system (not shown).

As shown in FIG. 4A, as the substrate 2 is transferred in the horizontal direction, the substrate passes the first slit 117, through which ions generated from the first ion generator 110 disposed at the upper portion are streamed in, and then the ions are implanted in the upper portion of the substrate 2 as the substrate passes the first slit 117.

When the lower portion of the substrate 2 passes the second slit 127 where the second ion generating unit 120 is disposed, ions generated from the second ion generating unit 120 are implanted in the lower portion of the substrate 2. Areas of the substrate 2 where the ions have been implanted once are marked as A in FIG. 4B.

Figure 4B:
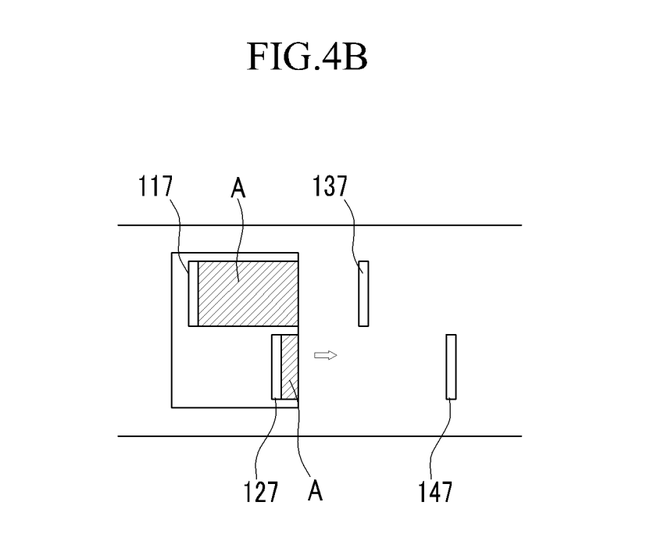

The ions from the first and second ion generators are continuously generated while the substrate 2 passes in front of the first and second slits 117 and 127.

Figure 4C:
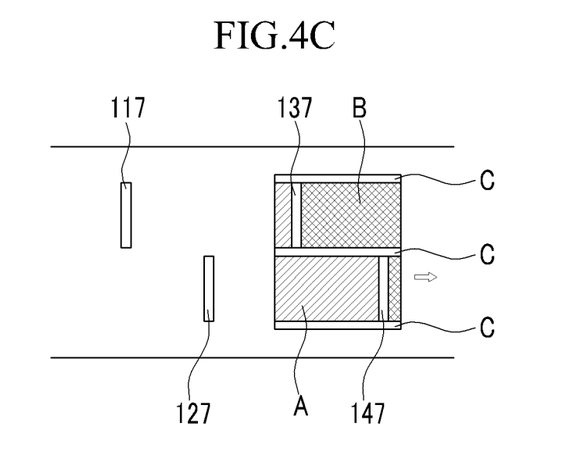

After the substrate 2 has passed the first slit 117 of the first ion generator 110 and the second slit 127 of the second ion generating unit 120, the substrate 2 sequentially passes the third slit 137 of the third ion generator 130 and the fourth slit 147 of the fourth ion generating unit 140.

While the substrate 2 passes the third slit 137 and the fourth slit 147, the ions are implanted to the upper and lower portions of the substrate 2.

In FIG. 4C, a substrate area that has been implanted with ions two times is marked as B and a substrate area implanted with ions once is marked as A. Areas marked as C are not implanted with ions.

In the present exemplary embodiment, the areas C include a center area of the substrate 2, corresponding to the gap g between the first and third slits and the second and fourth slits, the upper end portion of the substrate 2, and the lower end portion of the substrate 2.

Figure 4D:
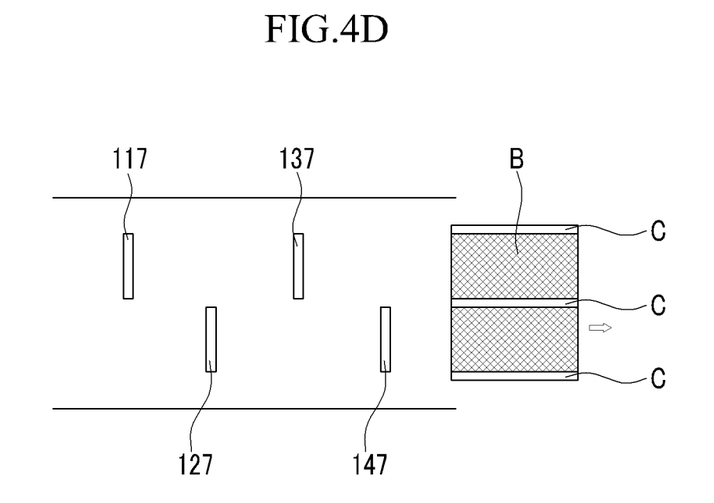

The upper and lower portions of the substrate 2 that have passed the fourth slit 147 of the fourth ion generating unit 140 are implanted with the ions two times.

When the ion implantation process is finished, that is, when the substrate 2 has passed the first slit 117, second slit 127, third slit 137 and fourth slit 147 such that ion implantation takes place twice in the upper region and twice in the lower region of the substrate 2, the substrate 2 is ejected from the ion implanting chamber 20 by being transferred to the unloading chamber 40.

Therefore, ion implantation into the substrate 2 can be finished while the substrate 2 passes through the ion implanting chamber 20 only once by using the ion implanting system according to the present exemplary embodiment so that the tact time of the ion implantation process can be significantly reduced.

In addition, the ion implanting system according to the exemplary embodiment can perform ion implantation on an eighth generation-sized substrate by forming the ion implanting chamber to which ions generated from the four ion generators can be simultaneously implanted and arranging four 1,250 mm ion generators in an alternating arrangement with respect to each other in the vertical direction, and accordingly, the ion implantation process can be performed on a large substrate, such as an eighth generation size, with ease. It is to be understood that the ion implanting system according to aspects of the present invention is not limited to systems that can perform ion implantation on an eighth generation substrate, but that the ion implanting system according to the present exemplary embodiment can be manufactured to be a system for implanting ions not only to the eighth generation substrate but also to a substrate smaller or larger than the eighth generation substrate.

For example, an ion implanting system corresponding to particular size of substrate can be formed by selecting the size of the slits of the ion generators.

In addition, according to another exemplary embodiment, an ion generating unit of an ion implanting system may be formed of three ion generators, respectively implanting ions to three portions, for example, an upper portion, a center portion, and a lower portion for ion implantation to a substrate larger than the eighth generation substrate.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An ion implanting system, comprising:
   an ion generating system to generate ion beams; and
   an ion implanting chamber to receive a work-piece to be irradiated with the ion beams generated from the ion generating system and to receive the ion beams generated from the ion generating system, wherein the ion generating system comprises a first ion generating unit to irradiate ions to an upper portion of the work-piece and a second ion generating unit to irradiate ions to a lower portion of the work-piece, wherein the first ion generating unit and the second ion generating unit are configured to generate the ion beams such that an area of the work-piece implanted with first ion beams generated from the first ion generating unit and an area of the work-piece implanted with second ion beams generated from the second ion generating unit do not overlap each other, and wherein an orientation of the received work-piece is fixed with respect to the first ion generating unit and the second ion generating unit as the work-piece moves through the ion implanting chamber.

2. The ion implanting system of claim 1, wherein the ion implanting chamber comprises a work-piece transfer guiding unit to guide the work-piece through the ion implanting chamber in a direction perpendicular to an implantation direction of the ion beams.

3. The ion implanting system of claim 1, wherein the first ion generating unit and the second ion generating unit each, respectively, comprise a plurality of ion generators arranged in parallel with each other at the same height in the horizontal direction.

4. The ion implanting system of claim 3, wherein the first ion generating unit and the second ion generating unit each, respectively, comprise at least two ion generators.

5. The ion implanting system of claim 3, wherein the plurality of ion generators of the first ion generating unit and the plurality of ion generators of the second ion generating unit are arranged in an alternating pattern.

6. The ion implanting system of claim 1, wherein the first ion generating unit is configured to implant the work-piece with the ions from the first ion generating unit prior to the ions from the second generating unit when the work-piece moves in a horizontal direction through the ion implanting chamber.

7. The ion implanting system of claim 1, wherein the second ion generating unit is configured to implant the work-piece with the ions from the second ion generating unit prior to the ions from the first ion generating unit when the work-piece moves in a horizontal direction through the ion implanting chamber.

8. The ion implanting system of claim 1, wherein one side of the ion implanting chamber comprises a plurality of slits through which ion beams from ion generators of the first ion generating unit and the second ion generating unit are respectively directed.

9. The ion implanting system of claim 8, wherein each slit has a width of 5.5 mm and a height of 1,250 mm.

10. The ion implanting system of claim 1, wherein the ion generating unit comprises:

a housing;

an ion generating unit provided in the housing and configured to generate plasma comprising ion desired species to be implanted in the substrate;

a power supply to supply power to the ion generating unit;

a mass separator to separate ions of the ion beams according to mass;

an ion accelerator to accelerate the ions separated by the mass separator; and an opening provided at one side of the housing, the opening comprising a slit through which the ions accelerated by the ion accelerator are directed to the ion implanting chamber.

11. An ion implanting system, comprising:

an ion generating system to generate ion beams; and an ion implanting chamber configured to receive a work-piece to be irradiated with the ion beams generated from the ion generating system and to receive the ion beams generated from the ion generating system, wherein the ion implanting chamber comprises a work-piece transfer guiding unit to guide the work-piece through the ion implanting chamber in a direction that is perpendicular to an implantation direction of the ion beams, wherein the ion generating system comprises a first set of ion generators to irradiate ions to a first portion of the work-piece as the work-piece moves through the ion implanting chamber and a second set of ion generators to irradiate ions to a second portion of the work-piece as the work-piece moves through the ion implanting chamber, wherein the first set of ion generators and the second set of ion generators are configured to generate the ion beams such that the first portion of the work-piece irradiated with first ion beams generated from the first set of ion generators and the second portion of the work-piece irradiated with second ion beams generated from the second set of ion generators do not overlap each other, and wherein an orientation of the received work-piece is fixed with respect to the first ion generating unit and the second ion generating unit as the work-piece moves through the ion implanting chamber.

12. The ion implanting system of claim 11, wherein the first set of ion generators and the second set of ion generators are arranged in an alternating pattern.

13. The ion implanting system of claim 11, wherein the first set of ion generators is configured to irradiate the first ion beams on the first portion of the work-piece, the first portion comprising an upper section of a surface of the work-piece, and the second set of ion generators is configured to irradiate the second ion beams on the second portion of the work-piece, the second portion comprising a lower section of the surface of the work-piece.

* * * * *